(12) United States Patent
Townley et al.

(10) Patent No.: US 6,195,279 B1
(45) Date of Patent: Feb. 27, 2001

(54) INCREASED CONTENT ADDRESSABLE MEMORY (CAM) DENSITY AND PERFORMANCE

(75) Inventors: Kent Townley, San Jose; Pablo M. Rodriguez, Burlingame, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/476,659

(22) Filed: Dec. 31, 1999

(51) Int. Cl.[7] .................................................. G11C 15/00

(52) U.S. Cl. ................. 365/49; 365/189.07; 365/189.11; 365/204

(58) Field of Search ........................ 365/49, 226, 189.07, 365/189.09, 189.11, 204

(56) References Cited

U.S. PATENT DOCUMENTS 5,325,507 * 6/1994 Freitas et al. ........................... 365/49
5,528,541 * 6/1996 Ghia et al. .............................. 365/49

* cited by examiner

*Primary Examiner*—Amir Zarabian
*Assistant Examiner*—Van Thu Nguyen
(74) *Attorney, Agent, or Firm*—Blakely, Sokoloff, Taylor & Zafman LLP

(57) ABSTRACT

A method and apparatus are provided for increasing the density and performance of a Content Addressable Memory (CAM). According to one embodiment, the CAM includes a comparison circuit, an enable circuit, and a bias circuit. The comparison circuit compares a stored bit to an input bit and outputs an inverted result of the comparison. The enable circuit receives as inputs the inverted result of the comparison and an enable input and produces an enabled comparison result. The bias circuit receives the enabled comparison result as its only input and discharges a pull-down line based upon the enabled comparison result.

15 Claims, 5 Drawing Sheets

INCREASED CONTENT ADDRESSABLE MEMORY (CAM) DENSITY AND PERFORMANCE

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

BACKGROUND OF THE INVENTION

1. Field of the Invention

The invention relates generally to Content Addressable Memory (CAM) logic. More particularly, the invention relates to improving the density and performance of CAMs.

2. Description of the Related Art

Content Addressable Memory (CAM) logic examines a data word and compares this data with internally stored data. This is a very common operation in high performance processors, as the result of the comparison is utilized to control the machine flow (e.g., determine what the machine will do next).

FIG. 1 illustrates a typical structure of a Content Addressable Memory (CAM) register. Multiple words (m in this example) of data are stored in different entries 102 of the register. Each word has n bits of data 101. Thus, there are m×n memory elements (CAM) in this register. At the top of the register, there is a control block 100 that enables the comparison and stores the result. For any particular entry in the register, the comparison will indicate a mismatch if any of the bits of input data 104 is different from the data stored in it.

An example of a current Content Addressable Memory (CAM) implementation will now be described with reference to FIG. 2. FIG. 2 is a schematic diagram illustrating a prior Content Addressable Memory implementation. The top of the figure shows how the comparison is enabled, and the comparison result is evaluated. Node 210 is pre-charged HIGH, and conditionally discharged if there is a mismatch in any bit when the evaluation is enabled. The bottom of the figure shows how the enable is distributed to all n bits of the register entry, and, in each one of them, it is connected to evaluation bias circuit 206. This circuit consists of n-MOS transistors 204 and 205. Transistor 204 is connected to the enable 200, and transistor 205 is connected to the result of the comparison 209 (doing a logic AND of both of them). When the enable is ON (clock HIGH), if the comparison in any bit of the register indicates a mismatch between the data stored 207 and the data input 208, node 210 is discharged and 201 indicates the mismatch. The bit comparison is computed by 211, a transmission gate XOR gate.

BRIEF SUMMARY OF THE INVENTION

According to one embodiment, a content addressable memory (CAM) includes a comparison circuit, an enable circuit, and a bias circuit. The comparison circuit compares a stored bit to an input bit and outputs an inverted result of the comparison. The enable circuit receives as inputs the inverted result of the comparison and an enable input and produces an enabled comparison result. The bias circuit receives the enabled comparison result as its only input and discharges a pull-down line based upon the enabled comparison result.

Other features and advantages of the invention will be apparent from the accompanying drawings and from the detailed description.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

A method and apparatus are described for increasing the density and performance of a Content Addressable Memory (CAM). In the following description, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

CAM Architecture Overview

Figure 3:
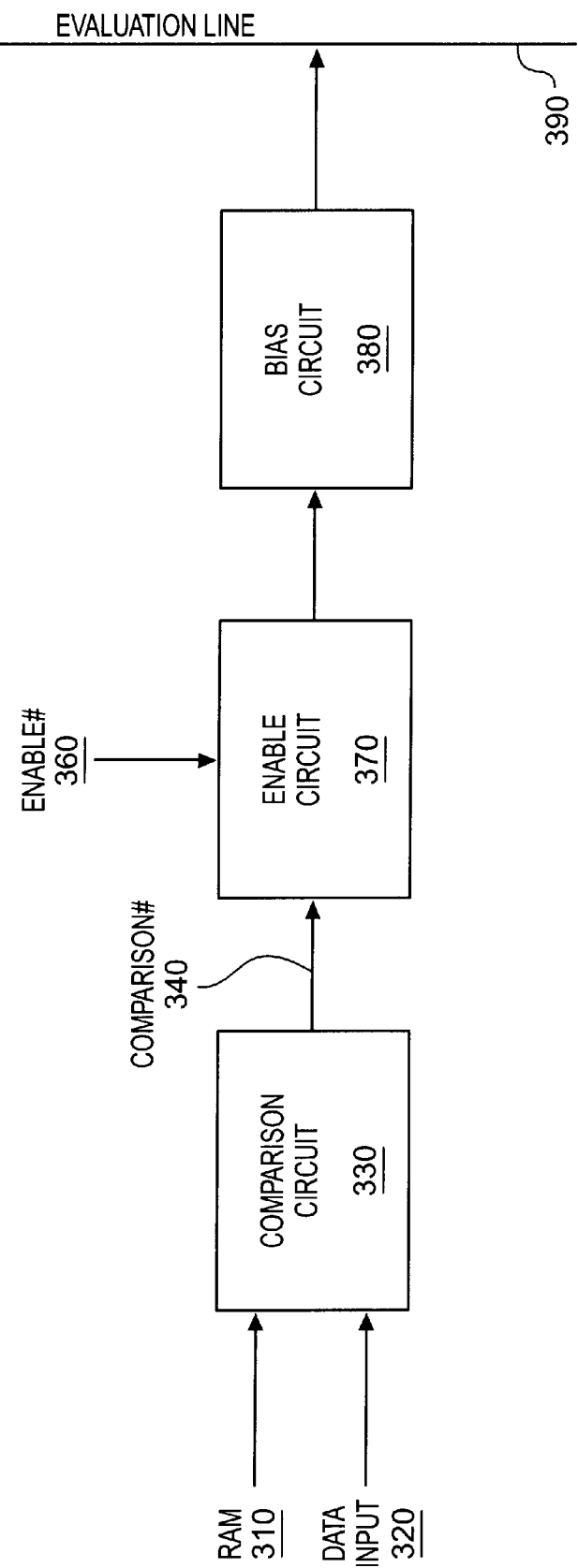
FIG. 3 is a high-level block diagram that illustrates a CAM according to one embodiment of the present invention.

FIG. 3 is a high-level block diagram that illustrates a CAM according to one embodiment of the present invention. In the example depicted, the CAM includes a comparison circuit 330, an enable circuit 370, a bias circuit 380, and an evaluation line 390. The comparison circuit 330 receives a stored bit from RAM 310 and compares it to a data input bit 320. The output of the comparison circuit 330 is Comparison# 340 representing the inverted result of the comparison.

The enable circuit 370 receives the inverted result of the comparison and an enable input and generates an enabled comparison that serves as the sole input to the bias circuit 380. Consequently, the bias circuit 380 discharges the evaluation line 390 based upon the enabled comparison.

Figure 4:
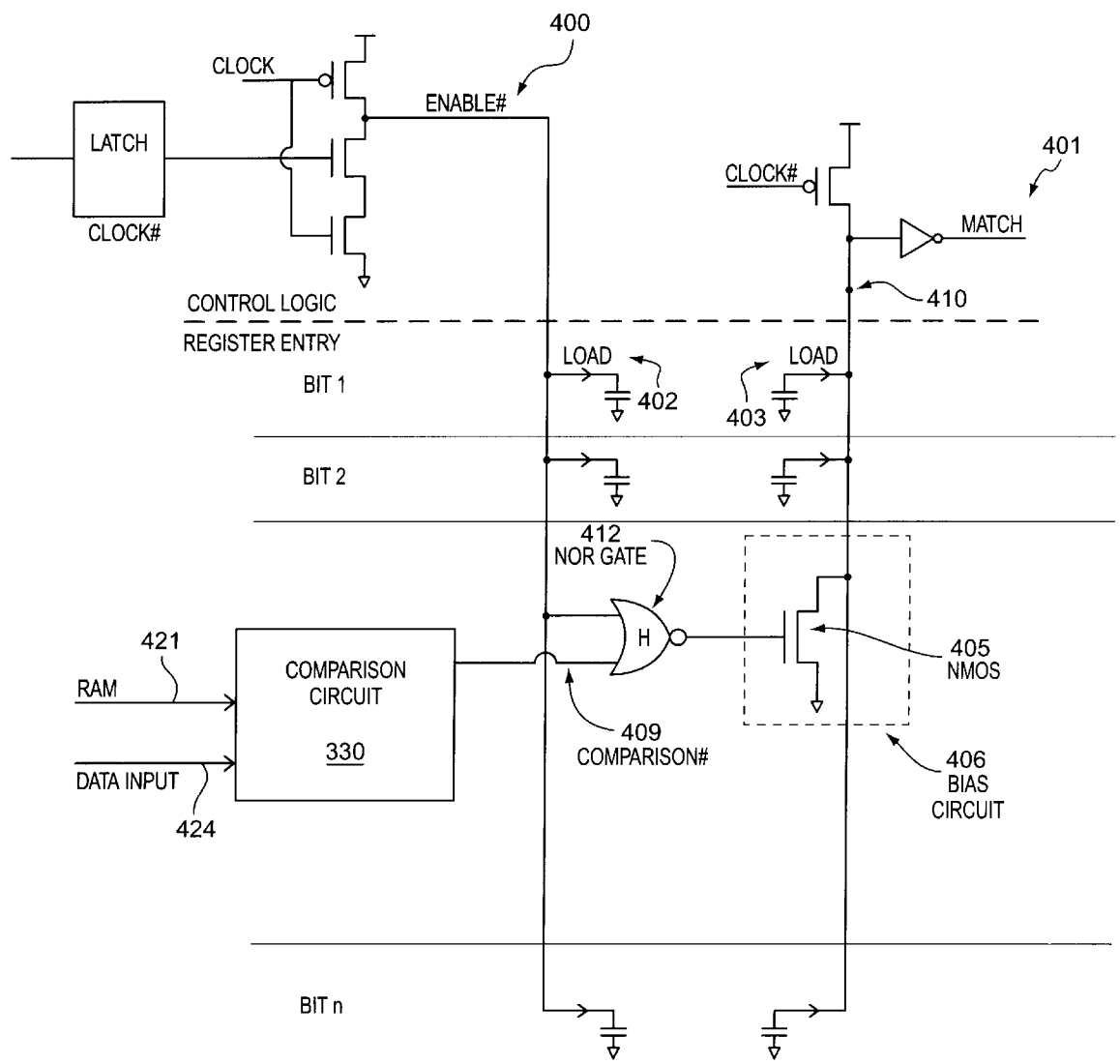
FIG. 4 is a schematic diagram that illustrates a CAM according to one embodiment of the present invention.

FIG. 4 is a schematic diagram that illustrates a CAM according to one embodiment of the present invention. According to this embodiment, the CAM includes the following key components: a bias circuit 406, an enable decoder (NOR 412), and a comparison circuit 330. Bias circuit 406 consists of a single n-MOS transistor 405. This makes the implementation twice as fast as the example illustrated in FIG. 2. One way to speed up the implementation of FIG. 2 would be to about triple the size of transistors 204 and 205. However, this would severely increase loads 202 and 203, blow-up the area of the register, and increase power consumption. Thus, the present embodiment of the invention is faster and smaller.

The enable decoder consists of a NOR gate 412. By feeding the inverse of enable and comparison into the NOR gate 412, its output is enable AND comparison. Thus, by implementing a logically equivalent function, this feature makes replacing bias circuit 206 with bias circuit 406 possible. Also, by decoding the enable with this high-skew NOR gate 412, a domino inverter can be used instead of 2 CMOS gates in the control logic, thereby further increasing the speed over that of FIG. 2. The noise at the output of the domino gate is a design constraint, as it is for the "wired-OR" pre-charged comparison line of the typical CAM of FIG. 2 (see nodes 210 and 410). This constraint can be overcome by isolating the pre-charged lines with VCC and VSS. The NOR gate 412 is very small, as the loading of 406 is much smaller than that of 206, for example, and its p-MOS transistors are not performance critical. Furthermore, the fan-out of 412 reduces load 402 even more compared to connecting the enable 400 directly to transistor 204 thereby speeding up the present embodiment further. Thus, this feature enables the use of bias circuit 406, speeds up the CAM, and reduces its area.

Figure 5:
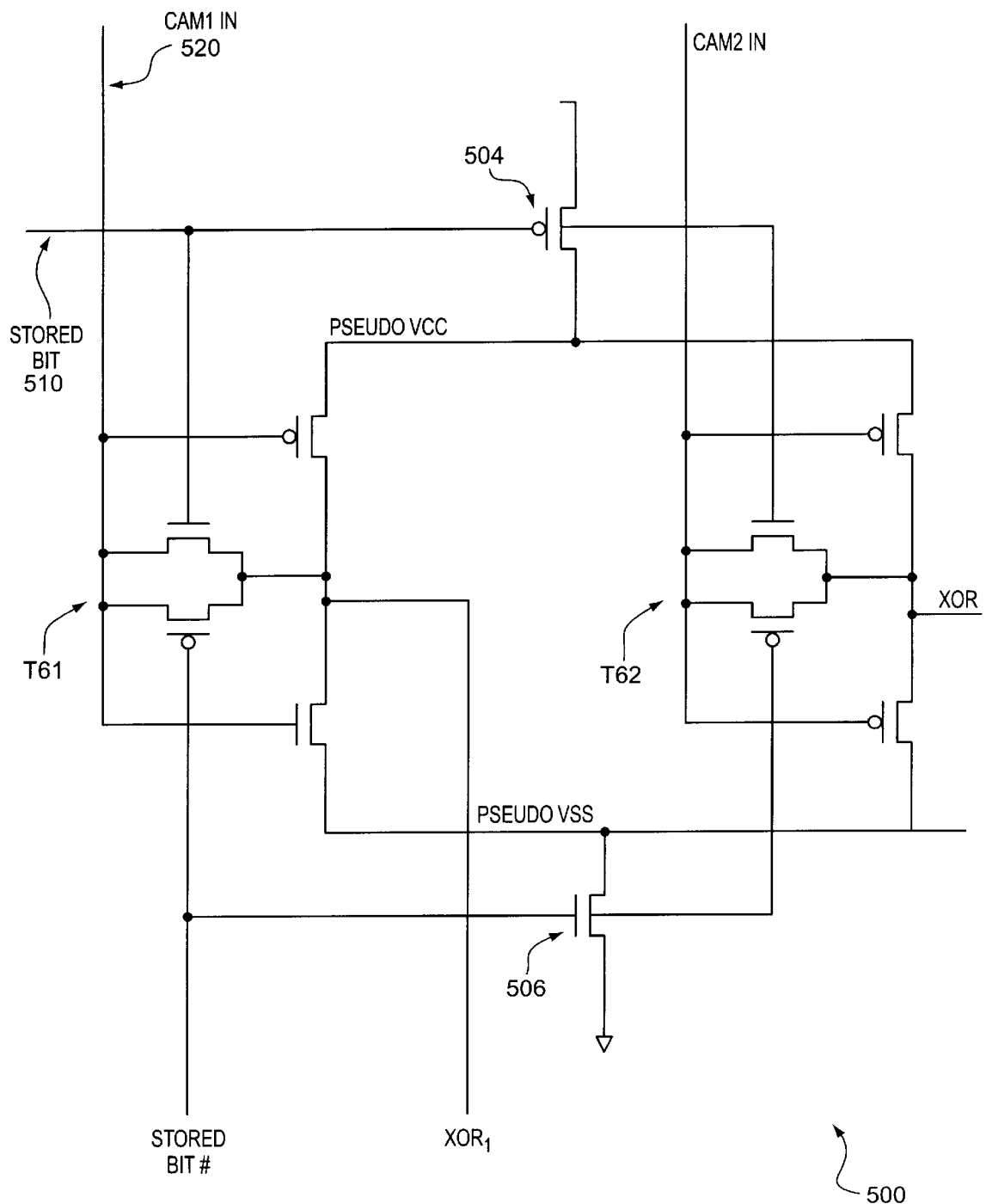
FIG. 5 is a schematic diagram that illustrates comparison logic according to one embodiment of the present invention.

FIG. 5 is a schematic diagram that illustrates comparison logic according to one embodiment of the present invention. The comparison circuit 500 uses XOR gates to compare stored data 510 to input data 520. Importantly, according to the embodiment depicted, the comparison is performed without having to invert the input data 520 as is typically done in the prior art such as that illustrated in FIG. 2 thereby making the this implementation smaller. Furthermore, the comparison takes only one gate delay in the worst case, making this implementation very fast.

In operation, an address comes in and the bit that was stored in RAM 510 sets up the path through which the address coming in 520 will go. The stored bit controls transmission gates TG1 and TG2.

If stored bit 510 is 0, then p-device 504 is turned on and Pseudo VCC is 1 (charged). On the other hand, when the stored bit 510 is 1, then n-device 506 is on and Pseudo VSS is 0.

Consequently, the resulting structure seen by the incoming address acts like an inverter. If the incoming address bit 520 is a 0, then p-device allows Pseudo VCC (which is 1) to propagate through to the NOR gate 412. Otherwise, if the incoming address bit 520 is a 1, then n-device allows Pseudo VSS (which is 0) to propagate through to the NOR gate 412. TG1 is off (doing nothing).

In the opposite case, when the stored bit is 1, then both 504 and 506 are off and Pseudo VCC and Pseudo VSS are unreliable values (floating). Then, TG1 is on and the incoming address simply passes through TG1 to the NOR gate 412. Therefore, in one case, the incoming address sees an inverter; and, in the other, it sees no resistance (based upon the stored bit).

Figure 1:
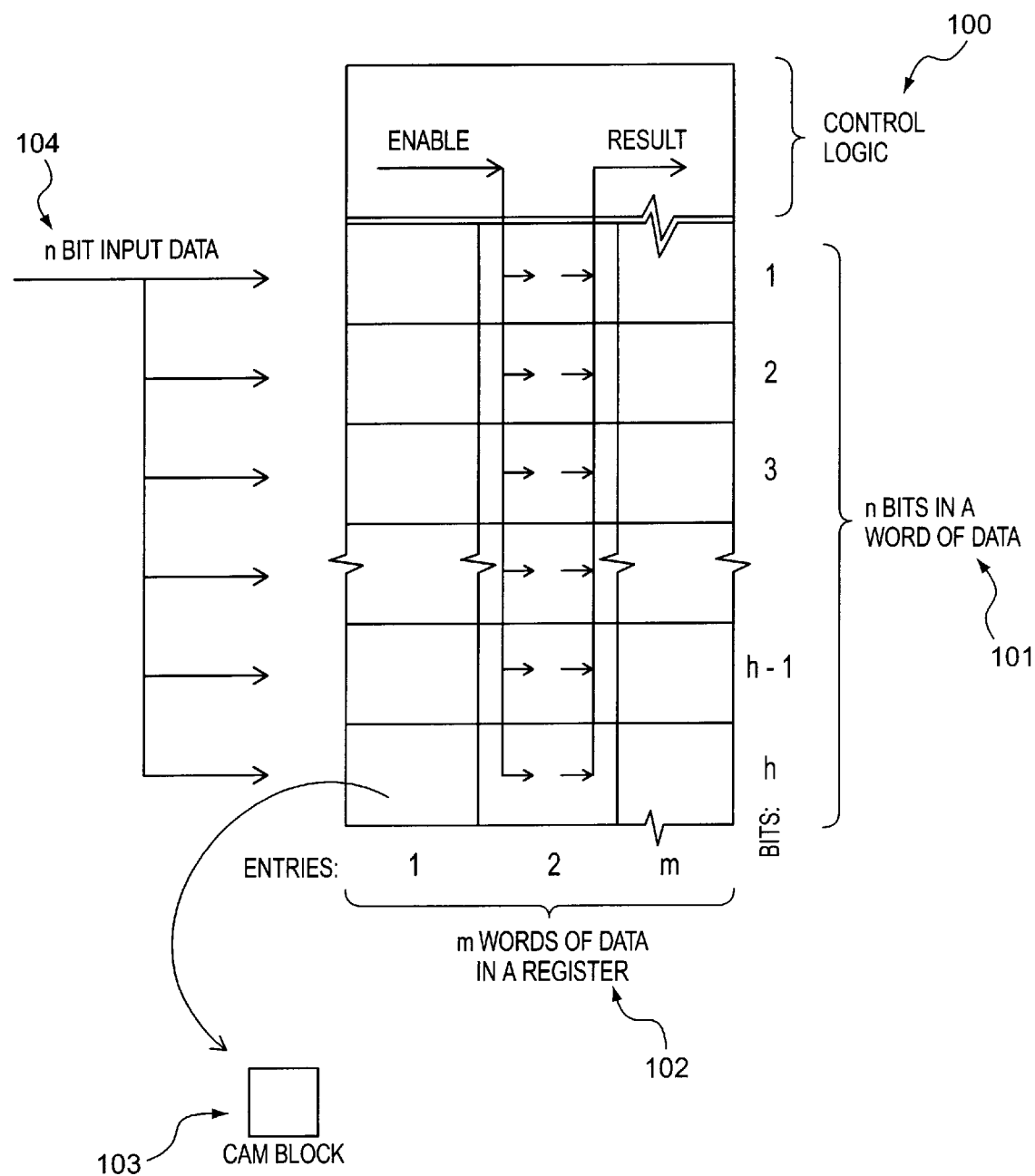
FIG. 1 conceptually illustrates a typical structure of a Content Addressable Memory (CAM) register.
Figure 2:
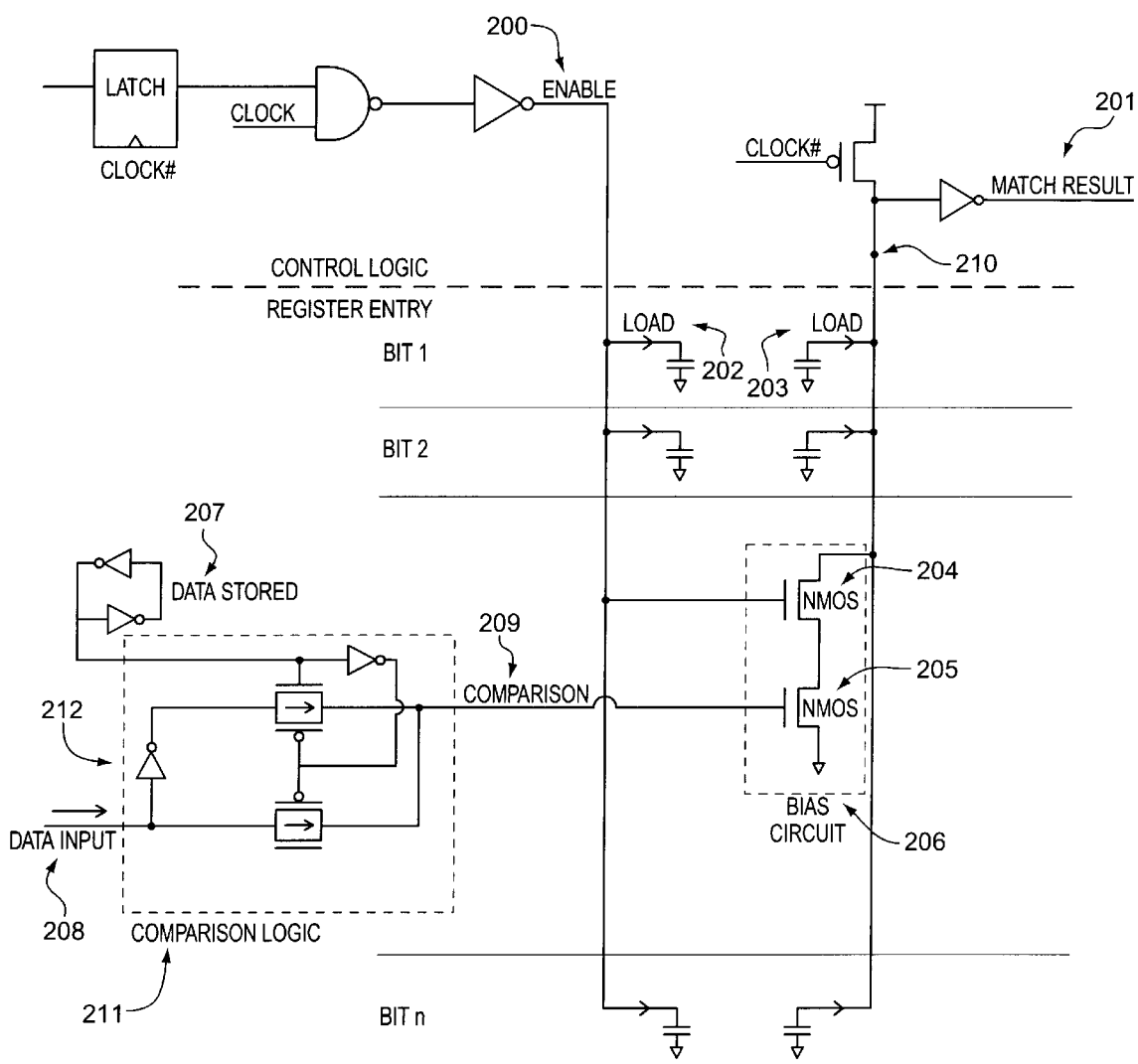
FIG. 2 is a schematic diagram illustrating a prior CAM implementation.

Thus, while the prior art design of FIG. 2 can take up to 1½ gate delays to compute the XOR (inverter+transmission gate), the design of the present embodiment takes only 1 gate delay in the worst case. Also, the present embodiment results in considerable area savings, as, for a typical register with 64 bit words, 8 entries and 2 CAM ports, 1024 inverters are saved (the only alternative being to route the inverse of the input data to every register too, which is usually impossible due to space constraints: data-path pitch is metal-limited). These savings will increase as future processor generations have ever wider busses.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A Content Addressable Memory (CAM) comprising:
   a comparison circuit to compare a stored bit to an input bit and output an inverted result of the comparison;
   an enable circuit having an input coupled to the inverted result of the comparison and having an enable input that produces an enabled comparison result; and
   a bias circuit receiving the enabled comparison result as its only input, the bias circuit discharging a pull-down line based upon the enabled comparison result.

2. The CAM of claim 1, wherein the bias circuit consists of a single n-MOS transistor.

3. The CAM of claim 1, wherein the comparison circuit generates the inverted result of the comparison without inverting the input data.

4. The CAM of claim 1, wherein a worst case delay associated with the comparison circuit is a one gate delay.

5. The CAM of claim 1, wherein the enable circuit comprises a high-skew NOR gate.

6. A method comprising:
   comparing a stored bit to an input bit to produce an inverted comparison signal;
   producing an enabled comparison signal based upon the inverted comparison signal and an inverted enable signal; and
   discharging a pull-down line by supplying the enabled comparison to a bias circuit coupled to the pull-down line.

7. The method of claim 6, wherein said comparing is performed without inverting the input data.

8. The method of claim 6, wherein a worst case delay associated with said comparing is a one gate delay.

9. The method of claim 6, wherein said producing an enabled comparison signal comprises NORing the inverted comparison and the inverted enable signal.

10. A Content Addressable Memory (CAM) comprising:
    a comparison means for comparing a stored bit to an input bit to produce an inverted comparison signal;
    an enable means for producing an enabled comparison signal based upon the inverted comparison signal and an inverted enable signal; and
    a biasing means for discharging a pull-down line by applying the enabled comparison to the pull-down line.

11. The CAM of claim 10, wherein the enable means comprises a high-skew NOR gate.

12. The CAM of claim 10, wherein the biasing means consists of a single n-MOS transistor.

13. The CAM of claim 10, wherein the comparison means generates the inverted result of the comparison without inverting the input data.

14. The CAM of claim 10, wherein a worst case delay associated with the comparison means is a one gate delay.

15. The CAM of claim 10, wherein the enable means comprises a NOR gate.

* * * * *

UNITED STATES PATENT AND TRADEMARK OFFICE
CERTIFICATE OF CORRECTION

PATENT NO. : 6,195,279 B1
DATED : February 27, 2001
INVENTOR(S) : Townley et al.

It is certified that error appears in the above-identified patent and that said Letters Patent is hereby corrected as shown below:

<u>Column 4,</u>
Line 25, after "method" insert -- for operating a Content Addressable Memory (CAM) --.

Signed and Sealed this

Twenty-second Day of October, 2002

Attest:

JAMES E. ROGAN
Director of the United States Patent and Trademark Office

Attesting Officer